United States Patent
Skidmore et al.

[11] Patent Number: 5,923,481
[45] Date of Patent: Jul. 13, 1999

[54] MICROLENS FRAMES FOR LASER DIODE ARRAYS

[75] Inventors: Jay A. Skidmore; Barry L. Freitas, both of Livermore, Calif.

[73] Assignee: The Regents of the University of California, Oakland, Calif.

[21] Appl. No.: 08/753,656

[22] Filed: Nov. 27, 1996

[51] Int. Cl.$^6$ ................................................. G02B 7/02
[52] U.S. Cl. ................................ 359/819; 359/623; 385/35; 385/83; 385/88; 385/137
[58] Field of Search ........................... 359/623, 620, 359/819, 818, 664; 385/35, 65, 18, 49, 83, 88, 129, 137; 250/332

[56] References Cited

U.S. PATENT DOCUMENTS

| | | | |
|---|---|---|---|
| 3,582,424 | 6/1971 | Narvaisa | 359/623 |
| 4,402,572 | 9/1983 | Tsunoda et al. | 359/623 |
| 4,669,832 | 6/1987 | Wolken | 359/664 |
| 5,081,639 | 1/1992 | Snyder et al. | 372/101 |
| 5,105,429 | 4/1992 | Mundinger et al. | 372/34 |
| 5,155,631 | 10/1992 | Snyder et al. | 359/708 |
| 5,181,216 | 1/1993 | Ackerman et al. | 385/35 |
| 5,404,417 | 4/1995 | Johnson et al. | 385/137 |
| 5,544,269 | 8/1996 | Hattori | 385/88 |
| 5,602,951 | 2/1997 | Shiota et al. | 385/83 |
| 5,611,014 | 3/1997 | Basavanhally | 385/83 |
| 5,644,667 | 7/1997 | Tabuchi | 385/83 |
| 5,689,599 | 11/1997 | Shahid | 385/83 |

*Primary Examiner*—Loha Ben
*Attorney, Agent, or Firm*—John P. Wooldridge

[57] ABSTRACT

Monolithic microlens frames enable the fabrication of monolithic laser diode arrays and are manufactured inexpensively with high registration, and with inherent focal length compensation for any lens diameter variation. A monolithic substrate is used to fabricate a low-cost microlens array. The substrate is wet-etched or sawed with a series of v-grooves. The v-grooves can be created by wet-etching, by exploiting the large etch-rate selectivity of different crystal planes. The v-grooves provide a support frame for either cylindrical or custom-shaped microlenses. Because the microlens frames are formed by photolithographic semi-conductor batch-processing techniques, they can be formed inexpensively over large areas with precise lateral and vertical registration. The v-groove has an important advantage for preserving the correct focus for lenses of varying diameter.

12 Claims, 3 Drawing Sheets

MICROLENS FRAMES FOR LASER DIODE ARRAYS

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to laser diode arrays, and more specifically, it relates to microlens frames for laser diode arrays.

2. Description of Related Art

Laser diode arrays are used in a wide range of commercial, medical and military applications: materials processing (soldering, cutting, metal hardening), display technology/graphics, medical imaging (MRI) and surgical procedures (corneal shaping, tissue fusion, dermatology, photodynamic therapy), satellite communication, remote sensing, and laser isotope separation. In certain solid-state laser applications, it is desirable to use laser diode arrays to optically excite, i.e. "pump," the crystal hosts. Diodes offer a narrow band of emission (reducing thermal lensing), compactness, high electrical efficiency and higher reliability as compared to flash lamps. Despite these numerous advantages, however, diode-pumped solid-state lasers (DPSSLs) have gained slow market acceptance due to the high cost associated with the laser diode array pumps. Significant diode array cost reductions would enable wide deployment of DPSSLs and new architectures to be realized that were previously cost prohibitive. In particular, low-cost diode arrays would bolster the inertial confinement fusion (ICF) and inertial fusion energy (IFE) programs that require laser diode arrays in very high volumes.

Historically, much of the research and development in this area was devoted to solving diode material and fabrication issues in order to improve the yield and reliability of laser diodes. High quality InAlGaAs and InGaAsP laser diodes are now commercially available for pumping Nd:YAG at ~810 nm. As much as 100 W/cm of peak power is possible under pulsed operation, and over 10,000 hours of continuous wave operation in commercial systems has been demonstrated at ~30 W/cm. Although these types of performance improvements have led to cost reductions in the past, there has not been a complementary improvement in the packaging technology, which is now limiting further cost reductions from being achieved.

To date, most packaging/heatsink schemes use a "rack and stack" architecture. In this method, individual laser bars are fabricated into sub-assemblies, and the sub-assemblies are then bonded together to produce larger two-dimensional arrays. Labor intensive steps associated with handling individual components prevents the production of arrays in large volume and in high yield. To reduce manufacturing costs it is important to utilize a monolithic approach for mounting laser diode bars. Similarly, it is advantageous to be able to microlens a large number of laser bars simultaneously.

SUMMARY OF THE INVENTION

It is an object of the present invention to provide monolithic microlens frames that will enable the fabrication of monolithic laser diode arrays.

It is another object of the present invention to manufacture monolithic lens frames inexpensively.

It is another object of the present invention to manufacture monolithic lens frames with high registration (horizontally and vertically).

It is another object of the present invention to manufacture monolithic lens frames with high registration with inherent focal length compensation (approximate and exact) for any lens diameter variation.

It is another object of the present invention to manufacture monolithic lens frames that will accommodate cylindrical or irregular, custom-shaped lenses.

A monolithic substrate is used to fabricate a low-cost microlens array. The substrate is wet-etched or sawed with a series of v-grooves. The v-grooves can be created by wet-etching, by exploiting the large etch-rate selectivity of different crystal planes. The v-grooves provide a support frame for either cylindrical or custom-shaped microlenses. Because the microlens frames are formed by photolithographic semiconductor batch-processing techniques, they can be formed inexpensively over large areas with precise lateral and vertical registration. The v-groove has an important advantage for preserving the correct focus for lenses of varying diameter.

A variety of embodiments of the microlens frame are possible. A slot-frame structure resembles a ladder. The v-grooves are etched through the substrate. The length of the grooves corresponds to the length of the diode emission. The individual lens frames are then separated. Afterwards, the individual microlenses are bonded to the frame. Another slot-frame structure is etched from both sides to also resemble a ladder. In this case, the v-grooves are etched through the substrate from both sides simultaneously. The rest of the fabrication steps are equivalent to that described above. This embodiment increases the total light emission that passes through the lens frame. A third embodiment resembles a rails-like structure. Once the v-grooves are formed, the substrate is sawed into series of "rails." The rails are fastened on either side of the laser diode array, and the microlenses are supported by their edges to the rails. The advantage of this approach is that there is no substrate to scatter the laser diode output light. A forth embodiment resembles a picture frame so that the rails are fully supported even without any microlenses present. This structure is more robust than the former, but is slightly more complicated to produce. Similar to the first case, the microlenses are supported at their edges and fastened to the sides of the frame.

DETAILED DESCRIPTION OF THE INVENTION

The invention is a monolithic substrate that is machined to form a microlens frame. A variety of embodiments are possible as shown below. Since there is no requirement of thermal conductivity of the frame, it is believed that Si makes an excellent candidate since it can be wet-etched with precision features (v-grooves) well suited for this application, and can also be easily sawed. The most common choices are described here.

Referring to FIGS. 1A–D, an etch mask (e.g., SiN having a thickness of a few thousand angstroms) is deposited over the entire substrate 10. Photolithography is used to define a series of stripes. The stripe width corresponds to the opening width of the v-groove 12 to be formed, and the pitch of the stripes will correspond to the pitch of the laser bar array. After the photoresist is patterned onto the SiN, the remaining SiN is removed (e.g., by $CF_4$ plasma) from the areas not protected by the photoresist.

Figure 1A:
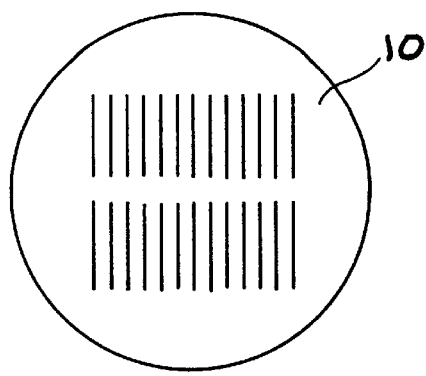
FIGS. 1A–D generally illustrate the process for making the microlens array.
Figure 1B:
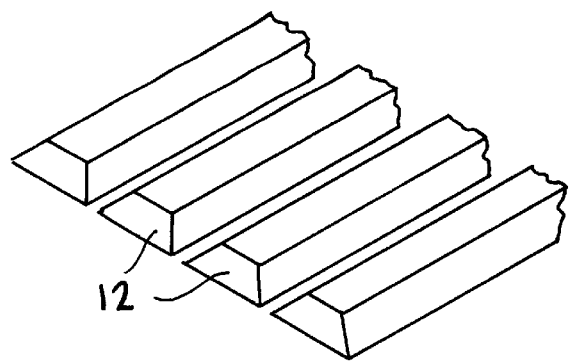
Figure 1C:
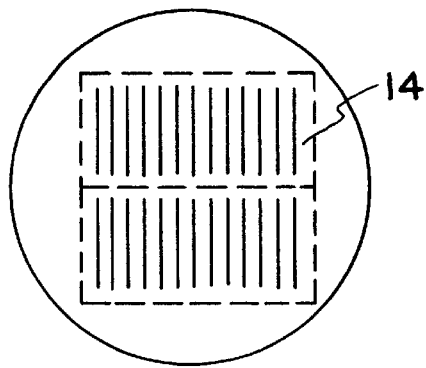
Figure 1D:
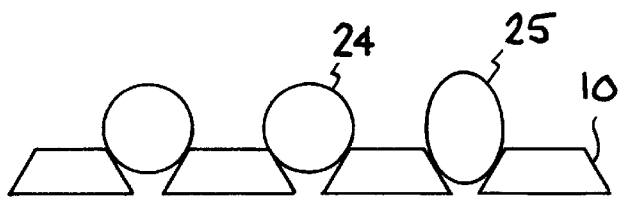

The substrate is then wet-etched. The wet etchant (e.g., KOH-based) provides a high etch-rate selectivity between different crystal planes; the {111} planes etch much slower than all other crystal planes (~200–600 times), so for prolonged etching, a v-groove 12 is formed by these {111} crystal planes. An advantage of this is that the v-groove feature will retain its approximate shape even if it is "over etched" (i.e., etched past completion). An additional advantage is that the v-groove to v-groove spacing remains invariant to etch depth or etch time. Individual lens arrays 14 can then be separated and individual microlenses can be bonded thereto. FIG. 1D shows a side view of a completed embodiment having a substrate 10 with cylindrical microlenses 24 or a custom shaped microlens 25.

A "splay" pattern is sometimes first etched into the substrate to determine the exact orientation of the substrate, since the flats of the substrates are not usually better than a degree (which would otherwise lead to roughness along the edges of the grooves). The patterning and etching steps of the splay pattern are analogous to those used for the v-groove formation. Unless extremely high registration is required, etching a splay pattern will be unnecessary.

Silicon substrates with either <100> or <110> surface orientation can be used to form v-grooves. In the case of the (100) surface plane, v-grooves can be formed along two orthogonal directions [01-1] or [011]. The full angle of the v-groove is approximately 70.5°. In the case of the (110) surface plane, the stripes should lie along the [1-10] direction in order to form a v-groove. The full angle of the v-groove is approximately 109.5° in this case. It is often desirable to specify that the major flat edge (which is used for course alignment) should lie normal to the [1-10] direction so that v-grooves will also run normal to the flat regardless of which side of the wafer is wet etched. Several types of lens frames can be fabricated using this wet etching technique. In each of the embodiments, it is assumed that once the desired features are formed in the substrate, the individual lens frames will be separated from each other using a dicing saw. In each case, many lens frames can be fabricated from a single Si substrate depending on the array size. Afterwards, the individual microlenses 24 are bonded to the frame (e.g., by epoxy or resin that cures upon exposure to UV radiation). The entire lens frame assembly can then be optically coated if desired (typically anti-reflection coatings are applied to reduce optical losses). Note that the precise angled edges also allows custom-shaped (non-cylindrical) microlenses to be oriented correctly. Custom-shaped microlenses could be used to improve collimation by reducing spherical aberrations. Examples of microlenses and methods of fabricating microlenses are shown in U.S. Pat. No. 5,155,631, filed Jan. 13, 1992, issued Oct. 13, 1992 and titled "Method of Fabrication of Cylindrical Microlenses of Selected Shape" and U.S. Pat. No. 5,081,639, filed Oct. 1, 1990, issued Jan. 14, 1992 and titled "Laser Diode Assembly Including a Cylindrical Lens," which is incorporated herein by reference.

Figure 2:
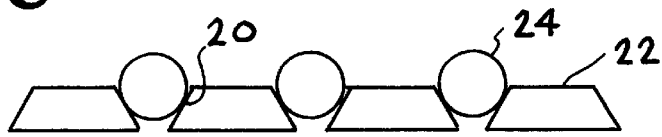
FIG. 2 shows a slot-frame structure the resembles a ladder.

A slot-frame structure resembles a ladder and is shown in FIG. 2. In this case, the v-grooves 20 are etched through the substrate 22 (the backside of the wafer is protected by the SiN mask). The length of the grooves 20 corresponds to the length of the emission (typically 1 cm for most laser bars). The SiN mask on the backside of the wafer would produce optical reflective losses from the underlying laser diode array. Therefore, it is usually removed (e.g., by wet etching in HF-based solution). The individual lens frames are then separated using a dicing saw.

Figure 3:
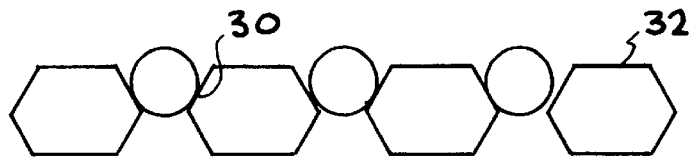
FIG. 3 shows a slot-frame structure etched from both sides.

A slot-frame structure etched from both sides, shown in FIG. 3, resembles a ladder. In this case, the v-grooves are etched through the substrate 32 from both sides simultaneously (using backside photolithographic alignment). In this case, the thickness of the substrate must be correlated with the width of the v-groove as well as the acceptance angle of the v-groove (which depends on which substrates are used, {100} or {110}). The v-grooves are etched until an opening breaks through. Prolonged etching will begin to attack the non-{111} planes that have been exposed, and will destroy the desired shape. The present embodiment increases the total light emission that passes through the lens frame (at the expense of having to pattern both sides, and to not allow excessive etching). The rest of the fabrication steps are equivalent to that described in the previous embodiments.

Figure 4A:
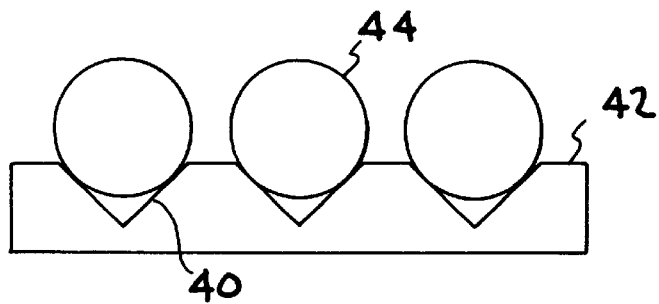
FIGS. 4A–C show a rails structure.
Figure 4B:
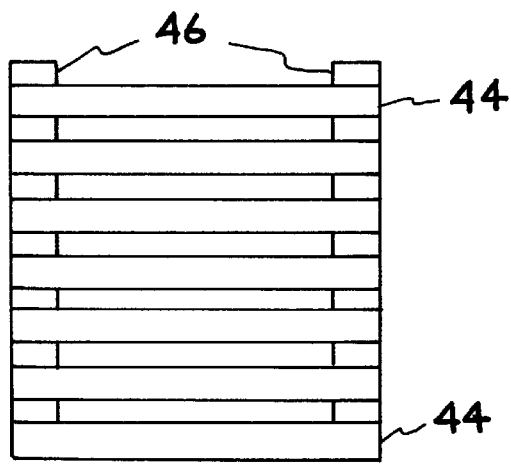
Figure 4C:
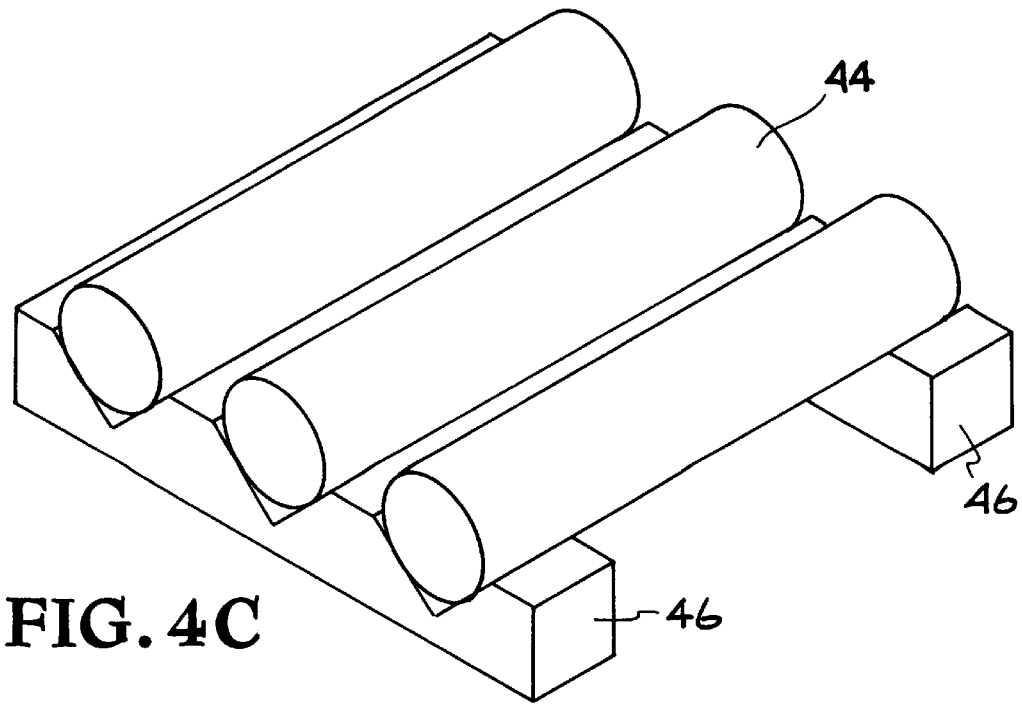

A rails-like structure is shown in FIGS. 4A–C. The thickness of the substrate is such that the v-grooves will remain terminated in the Si substrate, so that "over" etching is inconsequential to the desired feature (the backside is protected by the SiN mask). Once the v-grooves are formed, the substrate 42 is sawed into series of "rails." The rails are located on either side of the laser diode array, and the microlenses 44 are supported by their edges to the rails 46. They are then fastened to the rails. The advantage of this approach is that there is no Si substrate to scatter the laser diode output light, and a single substrate can produce many lens frames. A fixture for properly locating the rails can be formed using the same etched substrate (i.e., a "rail" whose width corresponds to the desired spacing between the two rails that will be used to form the lens frame). The rails will straddle the laser diode array that is located underneath. The lens frame assembly should be fastened to the laser diode array so that the lens frame will be protected from mechanical damage. FIG. 4C shows a perspective view of the rails embodiment.

Figure 5A:
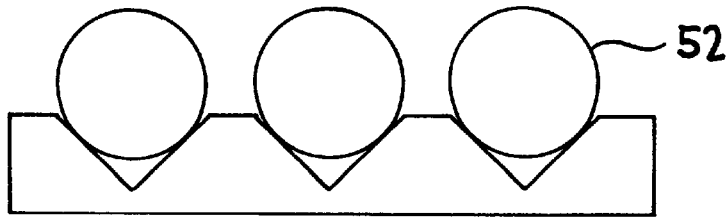
FIGS. 5A and B show a picture frame structure.
Figure 5B:
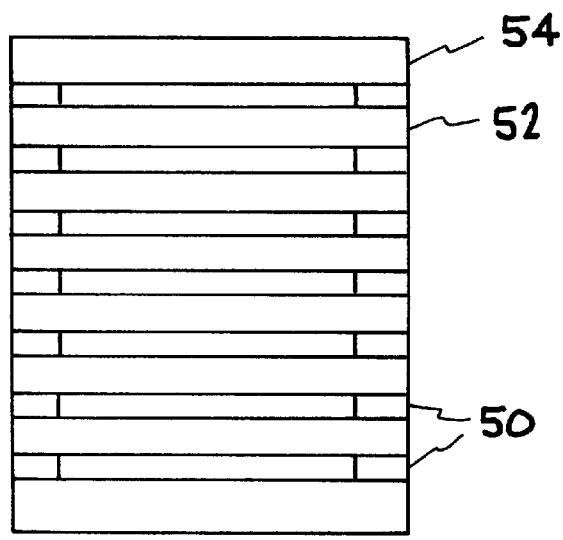
Figure 6:
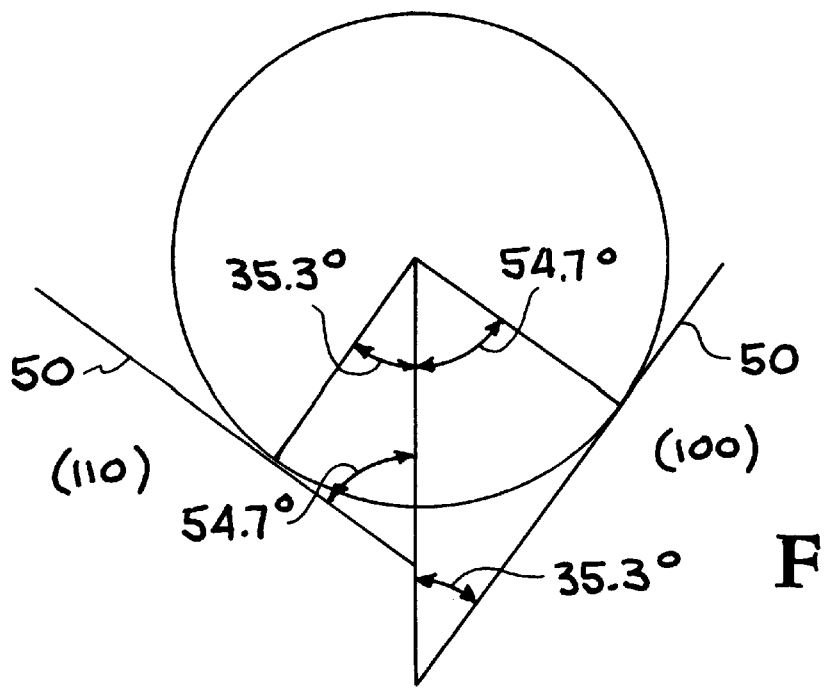
FIG. 6 shows the v-groove angle formed in a surface of a crystal having either a (110) or (100) orientation.

A picture frame structure, shown in FIGS. 5A and 5B, resembles a picture frame so that the rails 50 are fully supported even without any microlenses present. This structure is more robust than the former, but the etch mask is slightly more complicated. In this case, the etch mask will be removed in the center of the picture frame, so that the etching creates an opening window in the picture frame. Two sides of the picture frame (that will later be used to hold the lenses, will be patterned with a series of stripes, as before. The opposite two sides of the picture frame and backside of the wafer will be masked. However, for thick substrates, it will be desirable to pattern a window in the backside (that aligns with the frontside), to minimize etching time. Only a single etch step is needed to create the structure. Similar to the previous case, the microlenses 52 are supported at their edges and fastened to the sides of the frame 54. There is no Si support in the central region which might scatter the laser diode output light, as in the previous embodiment.

For all embodiments, the Si thickness can be chosen to correspond to the working distance of the microlenses, in such a way that the lens frame can lay flush against the laser diode array while maintaining proper output collimation. This reduces the degrees of freedom for lens alignment so as to simplify positioning of the lens assembly. Typically the lenses will be located at the focus corresponding to the circle of least confusion as to minimize the divergence (however, in certain applications greater divergence is desirable).

A critical factor for monolithic lensing is having precise registration of the v-grooves that locate the lenses. Lateral variation in the v-groove pitch will introduce pointing errors among the various laser bars, and vertical variations will prevent all laser diodes from being simultaneously focused. Using lithographic processes, both the lateral and vertical variations will be extremely accurate (within ~1 $\mu$m tolerances). Furthermore, any variations in lens diameter which alters the focal length, can be compensated by the v-groove. This occurs because both the v-groove and the focal length of the lens are proportional to the radius of the lens. For example, the "working distance" of the (110) lens frame is 1.225×R, and the (100) lens frame is 1.731×R, respectively (where R=lens radius). For a standard glass fiber lens (n~1.5), the "working distance" of the lens is ~1.6×R. Thus for a standard cylindrical fiber lens, a (100) lens frame would remain approximately in focus even for varying lens diameters. For cylindrical lenses with shorter focal lengths (e.g., graded index lenses), the (110) Si v-grooves would be more suitable.

FIG. 5 shows a side-view of the V-groove geometry created on (110) and (100) substrates. These orientations refer to the top surface of the Si substrate where the mask resides. In either orientation, the v-groove sidewalls are formed from the {111} crystal planes 50.

For cases in which the focal length of the lens frame must be even more precisely controlled, a v-groove can be sawed into the substrate with a v-shaped wheel that has a cutting angle that provides the exact matching focal length of the lens. The radius of the saw tip is not critical in this case because the cylindrical lens rests on the sides of the v-groove and not at the bottom. The simplest embodiment to fabricate is vitually identical to the lens frame shown in FIG. 4 (rails) except that the v-groove is formed by sawing. In this case the substrate material is not limited to Si, but any easily machinable material. High precision saws have vertical and lateral resolution tolerances that approach 1 $\mu$m, which is comparable to lithographic-type tolerances.

Changes and modifications in the specifically described embodiments can be carried out without departing from the scope of the invention, which is intended to be limited by the scope of the appended claims.

The invention claimed is:

1. A method for making a microlens frame, comprising:
    forming at least one v-groove in a substrate, wherein said at least one v-groove provides a support for a microlens; and
    removing portions of said substrate along the v-groove to allow passage of light.

2. The method of claim 1, wherein the step of forming at least one v-groove in a substrate includes wet-etching said substrate, wherein the etch-rate selectivity of crystal planes is employed.

3. The method of claim 1, wherein the step of forming at least one v-groove in a substrate includes sawing said substrate.

4. The method of claim 1, wherein the step of forming at least one v-groove in a substrate includes forming at least one v-groove through said substrate to produce separate microlens frames.

5. A method for making a microlens frame, comprising:
    forming at least one v-groove in a substrate, wherein said at least one v-groove provides a support for a microlens, wherein the step of forming at least one v-groove in a substrate includes etching said at least one v-groove from both sides of said substrate to produce separate microlens frames.

6. A method for making a microlens frame, comprising:
    forming at least one v-groove in a substrate, wherein said at least one v-groove provides a support for a microlens;
    sawing said substrate into at least two rails; and
    bonding said microlens to two rails from said at least two rails, wherein said microlens in said at least one v-groove is positioned to transmit light from a light source.

7. A method for making a microlens frame, comprising:
    forming at least one v-groove in a substrate, wherein said at least one v-groove provides a support for a microlens;
    sawing said substrate into at least two rails; and
    bonding said microlens to a support frame, wherein said microlens in said at least one v-groove is positioned to transmit light from a light source.

8. A microlens frame, comprising:
    a substrate, wherein portions of said substrate are removed to allow passage of light;
    at least one v-groove formed in said substrate, wherein said at least one v-groove provides a support for a microlens, and wherein said portions are along the v-groove.

9. The microlens frame of claim 8, wherein said at least one v-groove is formed through a central portion of said substrate to produce separate microlens frames.

10. A microlens frame, comprising:
    a substrate; and
    at least one v-groove formed in said substrate, wherein said at least one v-groove provides a support for a microlens, wherein said at least one v-groove is formed through a central portion of said substrate to produce separate microlens frames, wherein said at least one v-groove is etched from both sides of said substrate to produce separate microlens frames.

11. A microlens frame, comprising:
    a substrate; and
    at least one v-groove formed in said substrate, wherein said at least one v-groove provides a support for a microlens, wherein said substrate is sawed into at least two rails which are bonded to said microlens, wherein said microlens in said at least one v-groove is positioned to transmit light from a light source.

12. A microlens frame, comprising:
    a substrate; and
    at least one v-groove formed in said substrate, wherein said at least one v-groove provides a support for a microlens, wherein said substrate is sawed into at least two rails which are bonded to said microlens, wherein said microlens in said at least one v-groove is positioned to transmit light from a light source.

* * * * *